(12) United States Patent
Zou et al.

(10) Patent No.: US 10,319,697 B2
(45) Date of Patent: Jun. 11, 2019

(54) TRANSFERRING METHOD, MANUFACTURING METHOD, DEVICE AND ELECTRONIC APPARATUS OF MICRO-LED

(71) Applicant: Goertek, Inc., Shandong (CN)

(72) Inventors: Quanbo Zou, Shandong (CN); Zhe Wang, Shandong (CN)

(73) Assignee: Goertek, Inc., Shangdong (CN)

( * ) Notice: Subject to any disclaimer, the term of this patent is extended or adjusted under 35 U.S.C. 154(b) by 0 days.

(21) Appl. No.: 15/535,683

(22) PCT Filed: May 21, 2015

(86) PCT No.: PCT/CN2015/079507
§ 371 (c)(1),
(2) Date: Jun. 13, 2017

(87) PCT Pub. No.: WO2016/183844
PCT Pub. Date: Nov. 24, 2016

(65) Prior Publication Data
US 2017/0338199 A1    Nov. 23, 2017

(51) Int. Cl.
*H01L 23/00* (2006.01)
*H01L 33/00* (2010.01)
(Continued)

(52) U.S. Cl.
CPC ............. *H01L 24/97* (2013.01); *H01L 24/00* (2013.01); *H01L 24/81* (2013.01); *H01L 24/83* (2013.01);
(Continued)

(58) Field of Classification Search
CPC ......... H01L 24/97; H01L 33/62; H01L 24/81; H01L 24/83; H01L 25/0753;
(Continued)

(56) References Cited

U.S. PATENT DOCUMENTS 6,961,993 B2    11/2005    Oohata
2002/0043923 A1    4/2002    Natori
(Continued)

FOREIGN PATENT DOCUMENTS

CN    1349205    5/2002
CN    102244087    11/2011
(Continued)

OTHER PUBLICATIONS

International Search Report, PCT/CN2015/079507, dated Feb. 24, 2016 (7 pages).
(Continued)

*Primary Examiner* — Thanh T Nguyen
(74) *Attorney, Agent, or Firm* — Patent Law Works LLP

(57) ABSTRACT

A transferring method, a manufacturing method, a device and an electronic apparatus of micro-LED. The method for transferring micro-LED, comprises: forming micro-LEDs (202) on a laser-transparent original substrate (201), providing an anisotropic conductive layer (203) on a receiving substrate (204), bringing the micro-LEDs (202) into contact with the anisotropic conductive layer (203) on the receiving substrate (204), irradiating the original substrate (201) with laser from the original substrate side to lift-off the micro-LEDs (202) from the original substrate (201), and processing the anisotropic conductive layer (203), to electrically connect the micro-LEDs (202) with the pads (205') on the receiving substrate (204).

8 Claims, 13 Drawing Sheets

(51) Int. Cl.
*H01L 25/075* (2006.01)
*H01L 33/62* (2010.01)

(52) U.S. Cl.
CPC ...... *H01L 25/0753* (2013.01); *H01L 33/0079* (2013.01); *H01L 33/62* (2013.01); H01L 2224/81005 (2013.01); H01L 2224/81143 (2013.01); *H01L 2224/81815* (2013.01); H01L 2224/83005 (2013.01); H01L 2224/83143 (2013.01); H01L 2224/83851 (2013.01); H01L 2224/95001 (2013.01); H01L 2224/95144 (2013.01); H01L 2224/95145 (2013.01); H01L 2924/12041 (2013.01); *H01L 2933/0033* (2013.01); *H01L 2933/0066* (2013.01)

(58) Field of Classification Search
CPC ................. H01L 33/0079; H01L 24/00; H01L 2224/95001; H01L 2224/81005; H01L 2933/0066; H01L 2224/83005; H01L 2224/83143; H01L 2224/83851; H01L 2224/81143; H01L 2224/95144; H01L 2224/95145; H01L 2924/12041; H01L 2933/0033; H01L 2224/81815
See application file for complete search history.

(56) References Cited

U.S. PATENT DOCUMENTS

| | | |
|---|---|---|
| 2002/0064032 A1 | 5/2002 | Oohata |
| 2010/0047939 A1 | 2/2010 | Kamei |
| 2012/0056154 A1* | 3/2012 | Zaima ................. H01L 33/0079 257/13 |
| 2013/0210194 A1 | 8/2013 | Bibl et al. |
| 2014/0027709 A1 | 1/2014 | Higginson et al. |
| 2014/0061687 A1 | 3/2014 | Hu et al. |
| 2014/0312368 A1 | 10/2014 | Lee et al. |
| 2017/0373046 A1* | 12/2017 | Gardner .............. H01L 25/0753 |

FOREIGN PATENT DOCUMENTS

| | | |
|---|---|---|
| CN | 102800778 A | 11/2012 |
| CN | 103647012 A | 3/2014 |
| CN | 104115266 | 10/2014 |

OTHER PUBLICATIONS

International Search Report, PCT/CN2015/079508, dated Aug. 26, 2015 (8 pages).

* cited by examiner

TRANSFERRING METHOD, MANUFACTURING METHOD, DEVICE AND ELECTRONIC APPARATUS OF MICRO-LED

FIELD OF THE INVENTION

The present invention relates to Micro-Light Emitting Diode (micro LED) array for display, and in particular, to a method for transferring micro-LED, a method for manufacturing a micro-LED device, a micro-LED device and an electronic apparatus containing a micro-LED device.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LED will have a deep affection on the conventional display products such as LCD/OLED that have already been put into the market.

In the process of manufacturing micro-LEDs, micro-LEDs are first formed on a donor wafer, and then the micro-LEDs are transferred to a receiving substrate. The receiving substrate is a display screen, for example.

One difficulty during manufacturing a micro-LED lies in how to transfer a micro-LED from a donor wafer to a receiving substrate. In the prior art, the transfer is generally performed by means of electrostaticpick-up. A transfer head array will be needed during the electrostatic pick-up. The structure of the transfer head array is relatively complicated, and the stability thereof shall be considered. An extra cost shall be paid for manufacturing a transfer head array. A phase change shall be made before pick-up with the transfer head array. In addition, during manufacturing with a transfer head array, limitations apply to the thermo budget of a micro-LED for phase change, which is generally lower than 350° C., or more specifically, lower than 200° C.; otherwise, the performance of the micro-LED will be degraded. It generally requires two transfers during the manufacturing with transfer head array, i.e., the transfer from a donor wafer to a carrier wafer and the transfer from the carrier wafer to a receiving substrate.

U.S. Pat. No. 8,333,860B1 discloses an array of transfer heads for transferring micro devices, in which a voltage is applied to the electrode in the transfer head to pick-up a micro device. This patent is fully incorporated hereby as reference herein.

U.S. Pat. No. 8,426,227B1 discloses a method of forming a micro light emitting diode array, in which a micro-LED array is transferred to a receiving substrate by using a transfer head array. This patent is fully incorporated hereby as reference herein.

SUMMARY OF THE INVENTION

One object of this invention is to provide a new technical solution for transferring a micro-LED.

According to an embodiment of the present invention, there is provided a method for transferring micro-LED, comprising: forming micro-LEDs on a laser-transparent original substrate; providing an anisotropic conductive layer on a receiving substrate; bringing the micro-LEDs into contact with the anisotropic conductive layer on the receiving substrate; irradiating the original substrate with laser from the original substrate side to lift-off the micro-LEDs from the original substrate; and processing the anisotropic conductive layer, to electrically connect the micro-LEDs with the pads on the receiving substrate.

Preferably, the step of processing the anisotropic conductive layer further comprises: applying pressure on the anisotropic conductive layer from the micro-LED side by using an auxiliary substrate.

Preferably, the temperature of processing the anisotropic conductive layer is between 150° C. and 200° C., the applied pressure is between 1 MPa and 4 MPa, and the time period of applying pressure is between 10 second and 30 second.

Preferably, the auxiliary substrate is a flat rigid substrate.

Preferably, the surface of the auxiliary substrate is coated with temporary bonding polymer, and the step of processing the anisotropic conductive layer comprises: bonding the auxiliary substrate with the anisotropic conductive layer via the temporary bonding polymer; and after applying pressure, de-bonding the auxiliary substrate via the temporary bonding polymer, to remove the auxiliary substrate.

Preferably, the method further comprises: etching the temporary bonding polymer, to expose the epitaxial layers of the micro-LEDs; forming N-metal electrodes on the epitaxial layers of the micro-LEDs; and performing encapsulation on the N-metal electrodes.

Preferably, the anisotropic conductive layer is at least one of an anisotropic conductive film, an anisotropic conductive paste and an anisotropic conductive tape.

According to another embodiment of the present invention, there is provided a method for manufacturing a micro-LED device, comprising transferring a micro-LED to a receiving substrate by using the method according to the present invention.

According to another embodiment of the present invention, there is provided a micro-LED device, which is manufactured by using the method according to the present invention, wherein the micro-LEDs come into electronic contact with the pads on the receiving substrate via the anisotropic conductive layer.

According to another embodiment of the present invention, there is provided an electronic apparatus, containing a micro-LED device according to the present invention.

According to another embodiment of the present invention, there is provided a method for transferring micro-LED, comprising: transferring at least one micro-LED from an original substrate to a support body; transferring the at least one micro-LED from the support body to a backup substrate; and transferring the at least one micro-LED from the backup substrate to a receiving substrate.

Preferably, the original substrate is laser-transparent, and the step of transferring at least one micro-LED from an original substrate to a support body comprises: mounting the original substrate onto the support body, wherein the micro-LEDs are formed on the original substrate, the support body has light-release adhesive on its surface, and the micro-LEDs are adhered to the support body via the light-release adhesive, irradiating the original substrate with laser from the original substrate side, for lifting-off the at least one micro-LED from the original substrate, and irradiating light from the support body side, to release un-lifted-off micro-LEDs; wherein, the step of transferring the at least one micro-LED from the support body to a backup substrate comprises: bonding the support body with the at least one micro-LED to the backup substrate, and irradiating light from the support body side, to release the at least one micro-LED.

Preferably, the light-release adhesive is a UV tape, and the support body is stiff.

Preferably, the material of the support body is PET.

Preferably, the backup substrate has elastomer or polymer on its surface, and the step of transferring the at least one micro-LED from the support body to a backup substrate further comprises: bonding the at least one micro-LED to the backup substrate through the elastomer or polymer; wherein the step of transferring the at least one micro-LED from the backup substrate to a receiving substrate further comprises: aligning the at least one micro-LED with the pads on the receiving substrate; and lifting-off the at least one micro-LED via the elastomer or polymer.

Preferably, the method further comprises: forming red micro-LEDs on a growth substrate; transferring the red micro-LEDs to an intermediate substrate; and transferring the red micro-LEDs from the intermediate substrate to an original substrate.

Preferably, the method further comprises: coating polymer on the receiving substrate with micro-LEDs; curing the polymer; etching the polymer, to expose the epitaxial layers of the micro-LEDs; forming N-metal electrodes on the epitaxial layers of the micro-LEDs; and performing encapsulation on the N-metal electrodes.

According to another embodiment of the present invention, there is provided a method for manufacturing a micro-LED device, comprising transferring micro-LEDs to a receiving substrate by using the method according to the present invention.

According to another embodiment of the present invention, there is provided a micro-LED device, which is manufactured by using the method according to the present invention.

According to another embodiment of the present invention, there is provided an electronic apparatus, containing a micro-LED device according to the present invention.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that content which is not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
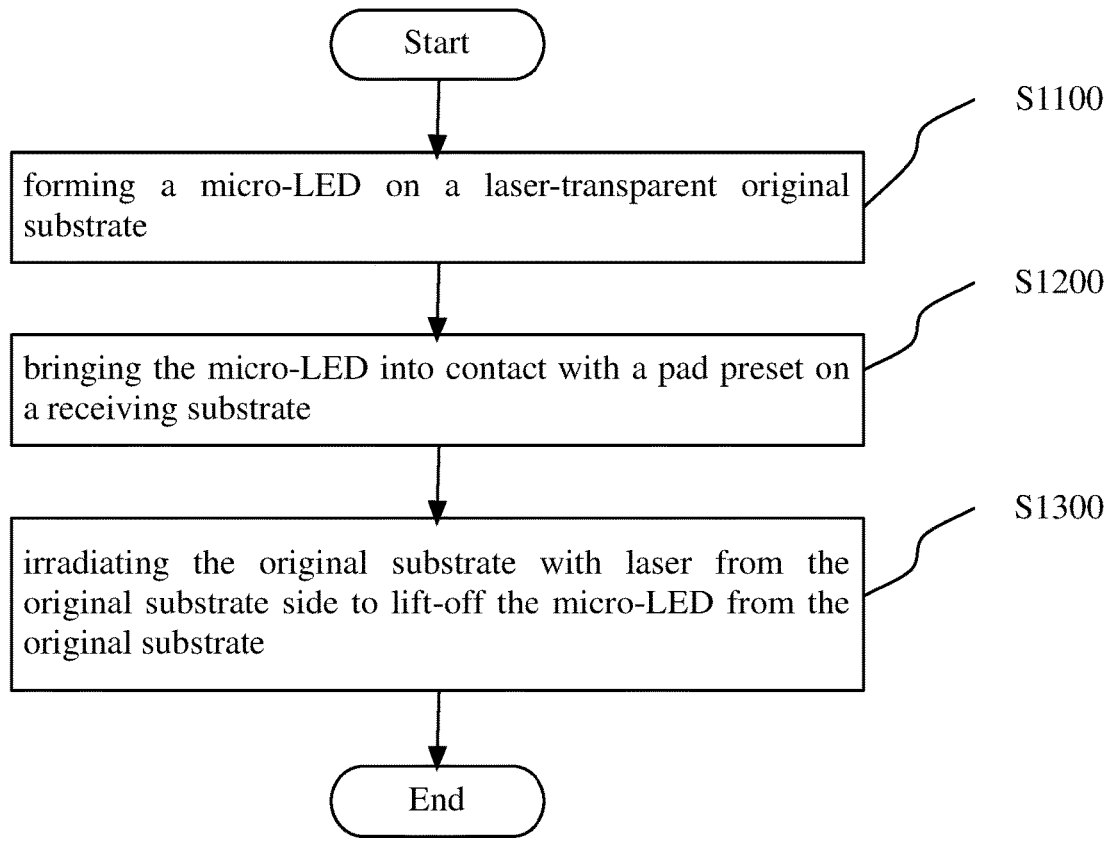
FIG. 1 shows a flow chart of an illustrative embodiment of the method according to the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described below with reference to the drawings.

FIG. 1 shows a flow chart of an illustrative embodiment of the method for transfer micro-LED according to the present invention.

As shown in FIG. 1, at step S1100, a micro-LED is formed on a laser-transparent original substrate.

The laser-transparent original substrate can be a sapphire substrate, SiC substrate and so on, for example. The micro-LED can be used for being mounted on a display screen-panel.

It should be understood by a person skilled in the art that one micro-LED could be formed on the original substrate, or a plurality of micro-LED could be formed on the original substrate. For example, a plurality of micro-LEDs can be formed on the laser-transparent original substrate. The plurality of micro-LEDs can form an array.

In an example, in a case where a plurality of micro-LEDs are formed on the laser-transparent original substrate, the original substrate can be singulated or divided into multiple pieces for more flexible transferring.

At step S1200, the micro-LED is brought into contact with a pad preset on a receiving substrate.

For example, the receiving substrate is a display screen panel.

For example, the pad can be set for red pixel array, yellow pixel array or blue pixel array.

In an example, in a case where a plurality of micro-LED are formed, at least one micro-LED of the plurality of micro-LEDs can be brought into contact with at least one pad preset on the receiving substrate. The at least one micro-LED could be one, several or all of the plurality of micro-LEDs. It should be understood by a person skilled in the art that, although it is just described here that at least one micro-LED, which is expected to be lifted-off, is in contact with a pad, a remaining micro-LED of the plurality of micro-LEDs can also be in contact with a pad.

For example, in the step of contact (S1200), the micro-LED can be brought into contact with the pad preset on the receiving substrate via a liquid thin film. For example, the liquid thin film can include flux. Herein, the lift-off of a micro-LED will be easy through the surface tension force of the liquid thin film (flux), and the successful rate is high.

At step S1300, the original substrate is irradiated with laser from the original substrate side to lift-off the micro-LED from the original substrate.

In an example, in a case where at least one micro-LED is in contact with pad, at least one area on the original substrate can be irradiated with laser from the original substrate side to lift-off the at least one micro-LED from the original substrate. For example, a technician can select the at least one area. For example, the at least one area corresponds to the at least micro-LED, respectively. The at least one area can be just partial area on the original substrate, or can be the whole area.

In another example, the original substrate can be offset for transferring additional micro-LEDs.

In another example, after the transferring using the original substrate, an additional laser-transparent backup substrate can be used to cope with a situation in which micro-LEDs are missing at some points on the display screen panel. For example, a micro-LED can be formed on an additional laser-transparent backup substrate; the micro-LED on the backup substrate is brought into contact with a pad preset on a receiving substrate; and the backup substrate is irradiated with laser from the backup substrate side to lift-off the micro-LED from the backup substrate. In such a way, the quality of a display screen can further be improved.

An array of micro-LEDs can be formed on the receiving substrate after the transferring of micro-LEDs to the receiving substrate.

After the transferring of micro-LEDs to the receiving substrate, the present invention can further include subsequent steps.

For example, the lifted-off micro-LEDs can be reflow-soldered on the receiving substrate. A negative electrode can be deposited on the micro-LEDs. The reflow-soldering can be performed after micro-LEDs of each color are transferred. Alternatively, The reflow-soldering can be performed after micro-LEDs of all colors are transferred.

In addition, the soldered micro-LED can be filled with polymer. For example, a confocal dielectric deposition can be used in stead of polymer filling.

In another embodiment, the present invention further includes a method for manufacturing a micro-LED device. The manufacturing method comprises transferring a micro-LED to a receiving substrate by using the method for transferring a micro-LED according to the present invention.

In another embodiment, the present invention further includes a micro-LED device, such as a display screen device. The micro-LED device can be manufactured by using the method for manufacturing a micro-LED device according to the present invention.

In comparison with the prior art, under the similar conditions, the micro-LED manufactured by using the solution of the present invention is relatively simple and reliable while maintaining a high quality, and the through put thereof is relatively high with low cost.

In another embodiment, the present invention further includes an electronic apparatus. The electronic apparatus contains a micro-LED device according to the present invention. For example, the electronic apparatus can be a mobile phone, a pad computer and so on.

In the solution of the present invention, a micro-LED is formed directly on the original substrate and it is transferred to a receiving substrate by means of laser lift-off. The solution of this invention have not been conceived by the prior art.

In addition, the micro-LED can be selectively transferred through the present invention.

In addition, in the solution of the present invention, the transfer can be performed only once while two transfers are needed in the prior art.

In addition, in comparison with the prior art, the solution of the present invention is relatively efficient, the cost is relatively low and product performance degrade due to an extra thermal budget will not occur.

In addition, in comparison with the prior art using a pick-up head, the present invention does not need a complicated pick-up system, and thus the cost of product manufactured using the present invention will relatively low and reliable.

In addition, since it does not need the temporary bonding in the prior art between the micro-LED and the intermediate carrier substrate, the cost can be further decreased by this invention.

Since it is not necessary to consider the phase change of bonding layer considered in the prior art using pick-up head, the manufacturing method of the present invention can have a relatively high through put and the extra thermal load limitation will be less. Consequently, under the similar conditions, the manufactured micro-LED will have a higher performance.

An example for transferring a micro-LED according to the present invention will be described below with reference to FIGS. 2A to 2G.

Figure 2A:
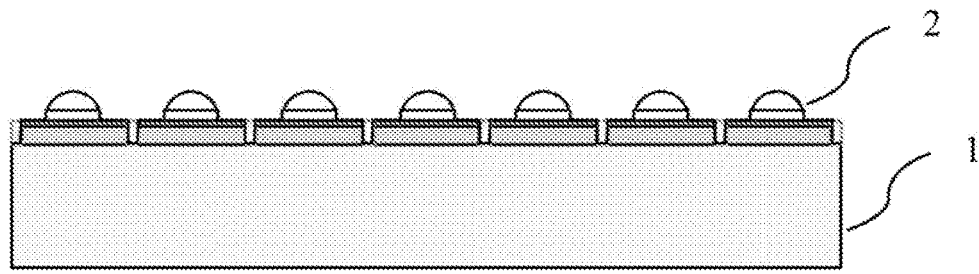
FIG. 2A to 2G shows an example for transferring a micro-LED according to the present invention.

As shown in FIG. 2A, micro-LEDs 2 are formed on a laser-transparent original substrate 1 such as sapphire substrate. The micro-LEDs 2 have a vertical micro-LED structure, for example. The micro-LEDs 2 contains, for example, a n-doped GaN layer, a multiple quantum well structure, a p-doped GaN layer, a p metal electrode, a bump, and so on.

As shown in FIG. 2A, the plurality of micro-LEDs 2 can be singulated.

Figure 2B:
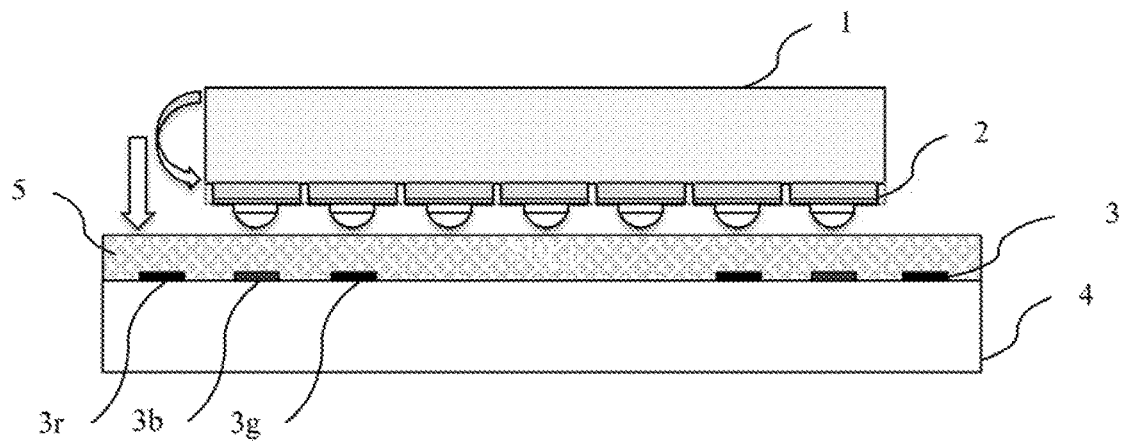

As shown in FIG. 2B, the original substrate 1 is flipped over, and is aligned with a receiving substrate 4 with liquid thin film (for example, containing flux) 5. The micro bumps on the mircro-LEDs are in contact with the flux. Pads 3 are preset on the receiving substrate 4. For example, the pads 3 include pad 3r for receiving red micro-LED, pad 3b for receiving blue micro-LED and pad 3g for receiving green micro-LED.

Figure 2C:
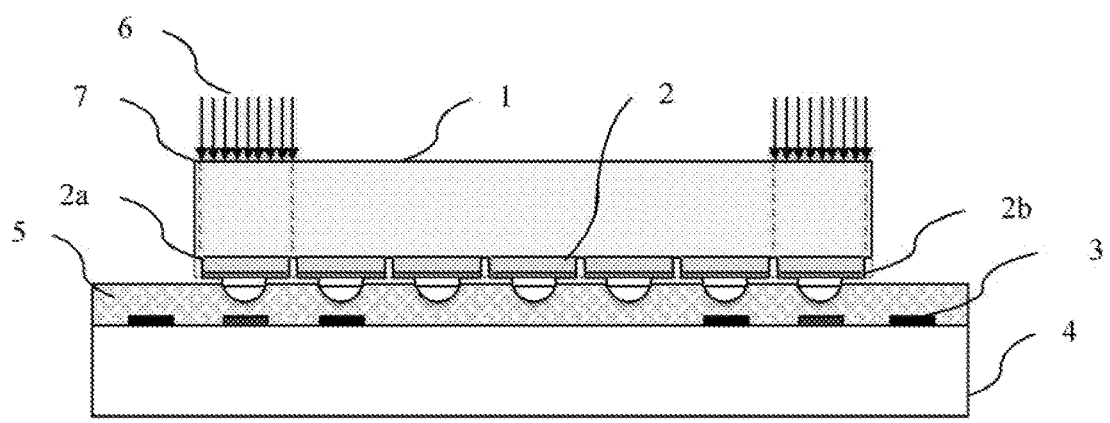

As shown in FIG. 2C, partial areas 7 on the original substrate are selectively irradiated with laser 7, to lift off the selected micro-LEDs 2a, 2b of the plurality of formed micro-LEDs from the original substrate.

Figure 2D:
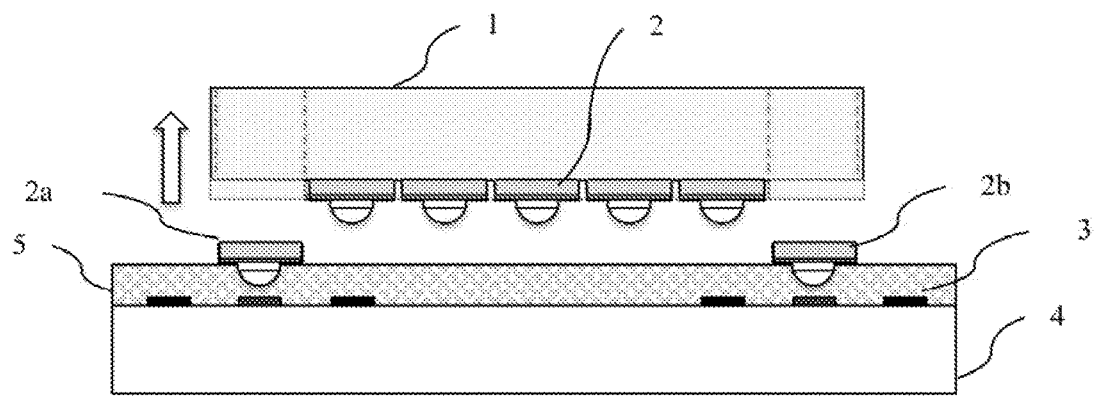

As shown in FIG. 2D, the original substrate 1 is lifted up. Because of the function of the surface tension force of the liquid thin film, the selected micro-LEDs 2a, 2b are lifted-off easily, while the other micro-LEDs are remained on the original substrate 1.

Then, the original substrate is moved and the operations of FIGS. 2C to 2D are repeated, so that a plurality of micro-LEDs are transferred to the receiving substrate.

Figure 2E:
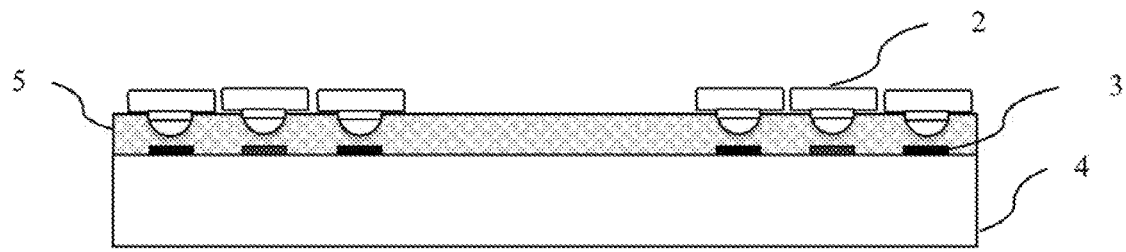

As shown in FIG. 2E, the plurality of micro-LEDs are transferred to the receiving substrate 4.

Figure 2F:
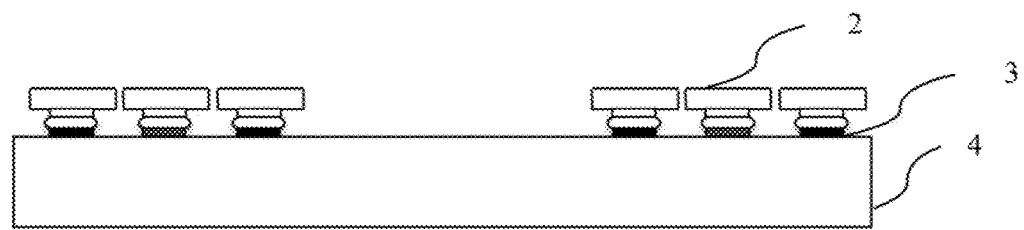

As shown in FIG. 2F, for example, the plurality of micro-LEDs are soldered onto the receiving substrate through reflow soldering. Then, the flux is cleaned.

Figure 2G:
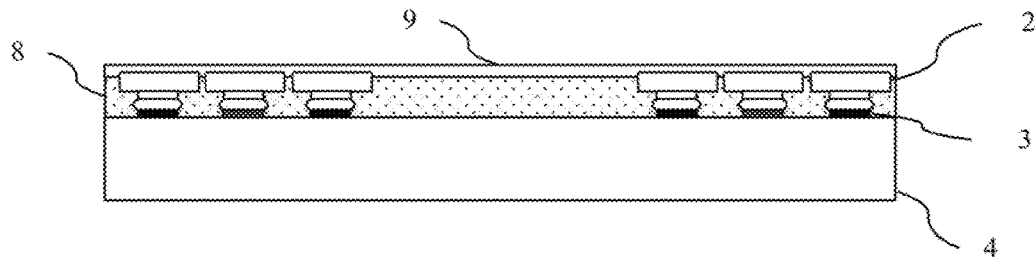

As shown in FIG. 2G, the receiving substrate is filled with polymer 8 and is sealed. Then, n-metal electrode 9 is deposited, for example, using ITO material.

Figure 3:
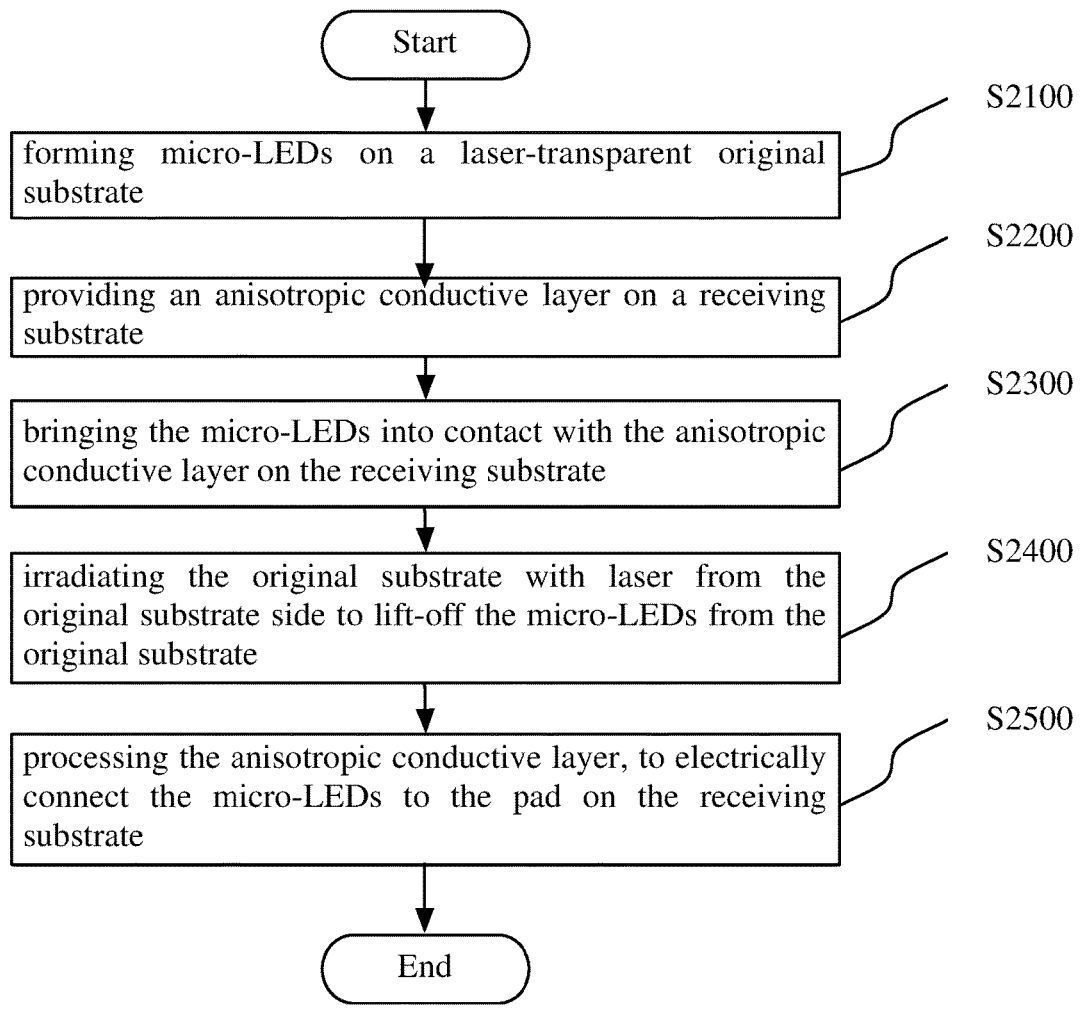
FIG. 3 shows a flow chart of another illustrative embodiment of the method according to the present invention.

FIG. 3 shows a flow chart of another illustrative embodiment of the method for transferring a micro-LED according to the present invention.

As shown in FIG. 3, at step S2100, micro-LEDs are formed on a laser-transparent original substrate.

At step S2200, an anisotropic conductive layer is provided on a receiving substrate. For example, the anisotropic conductive layer is at least one of an anisotropic conductive film (ACF), an anisotropic conductive paste (ACP) and an anisotropic conductive tape (ACT).

At step S2300, the micro-LEDs are brought into contact with the anisotropic conductive layer on the receiving substrate. For example, the micro-LEDs are adhered to the anisotropic conductive layer on the receiving substrate. At this step, the micro-LEDs can be aligned with the receiving substrate in advance, for example.

At step S2400, the original substrate is irradiated with laser from the original substrate side to lift-off the micro-LEDs from the original substrate.

For example, the above steps can be performed with respect to red micro-LEDs, green micro-LEDs and blue micro-LEDs, respectively. Since the transfer with respect to the three micro-LEDs can be regarded as a simple repeat of the above steps, they are not repeated here. As long as each of the above steps are performed in a solution, the solution will be covered by this invention.

At step S2500, the anisotropic conductive layer is processed to electrically connect the micro-LEDs (its electrodes) with the pads on the receiving substrate.

In an example, pressure can be applied on the anisotropic conductive layer from the micro-LED side by using an auxiliary substrate. For example, the temperature of processing the anisotropic conductive layer can be between 150° C. and 200° C. For example, the applied pressure is between 1 MPa and 4 MPa. For example, the time period of applying pressure is between 10 second and 30 second.

In an example, the auxiliary substrate can be a flat rigid substrate. The inventors of the present application have found that the possible displacement of the micro-LEDs can be reduced by using a rigid substrate. This point have not noticed by a person skilled in the art.

For example, the surface of the auxiliary substrate can be coated with temporary bonding polymer. In this situation, the step S2500 can further comprises: bonding the auxiliary substrate with the anisotropic conductive layer via the temporary bonding polymer; and after applying pressure, de-bonding the auxiliary substrate via the temporary bonding polymer, to remove the auxiliary substrate. The advantage of temporarily bonding the auxiliary substrate with the anisotropic conductive layer lies in that, the positions of the micro-LEDs can be relatively fixed, and the displacement of micro-LEDs during processing the anisotropic conductive layer is reduced.

After the above processes, normal subsequent processes can be done on the micro-LEDs. For example, the subsequent processes include: etching the temporary bonding polymer, to expose the epitaxial layers of the micro-LEDs; forming N-metal electrodes on the epitaxial layers of the micro-LEDs; and performing encapsulation on the N-metal electrodes.

For example, the receiving substrate can be a display substrate. Leads and pads can be set on the receiving substrate in advance, to be electronically connect with the micro-LEDs.

In this embodiment, the micro-LEDs and the receiving substrate are connected through a anisotropic conductive layer. This approach of processing is relatively simple and is more suitable for production in large bulk.

In another embodiment, the present invention further provides a method for manufacturing a micro-LED device. The manufacturing method comprises transferring micro-LEDs to a receiving substrate by using the method according to the present invention. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to the present invention. In the micro-LED device according to the embodiment, the micro-LEDs come into electronic contact with the pads on the receiving substrate via the anisotropic conductive layer, which is different from the micro-LED device in the prior art.

In another embodiment, the present invention further provides an electronic apparatus. The electronic apparatus contains a micro-LED device according to the embodiment. For example, the electronic apparatus can be a mobile phone, a pad and so on.

FIG. 4A to 4L shows another example for transferring a micro-LED according to the present invention.

Figure 4A:
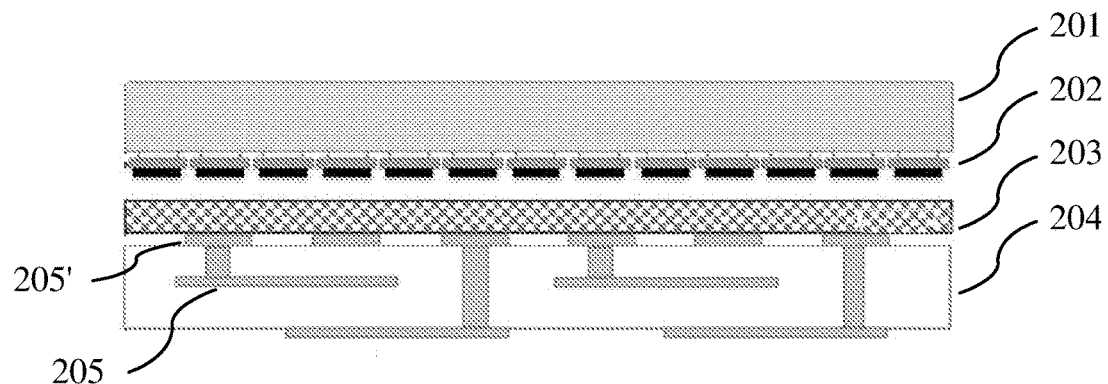
FIG. 4A to 4L shows another example for transferring a micro-LED according to the present invention.

As shown in FIG. 4A, an original substrate 201 such as a sapphire substrate has red micro-LEDs 202 thereon. The receiving substrate 204 such as display substrate has an anisotropic conductive film (ACF) 203 thereon. The receiving substrate 204 has signal leads 205 and pads 205' for connecting micro-LEDs.

Figure 4B:
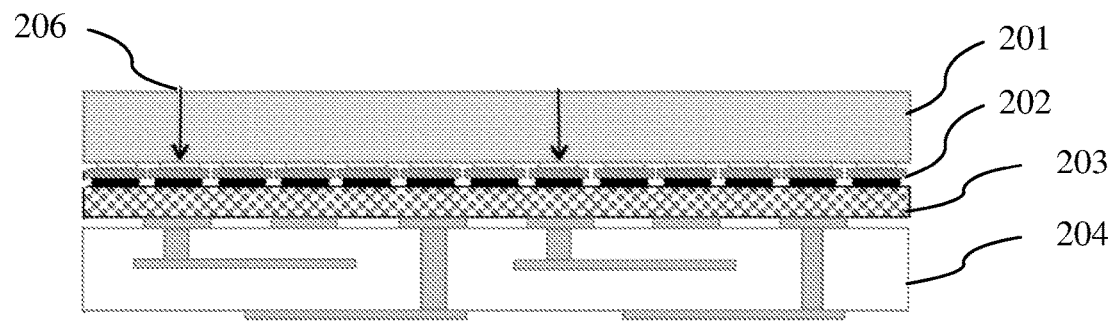

As shown in FIG. 4B, the original substrate 201 (red micro-LED 202) is brought into contact with the anisotropic conductive film 203 with a light force. For example, the red micro-LEDs 202 to be transferred can be aligned with the pads on the receiving substrate 204. The original substrate 201 is irradiated with laser 206, to selectively lift-off red micro-LEDs.

Figure 4C:
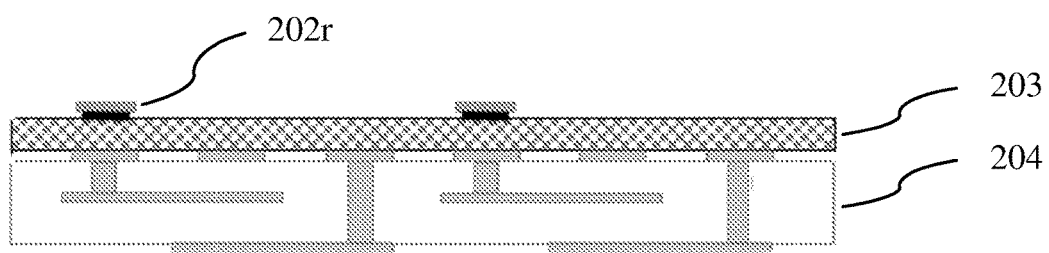

FIG. 4C shows lifted-off red micro-LEDs 202r.

Figure 4D:
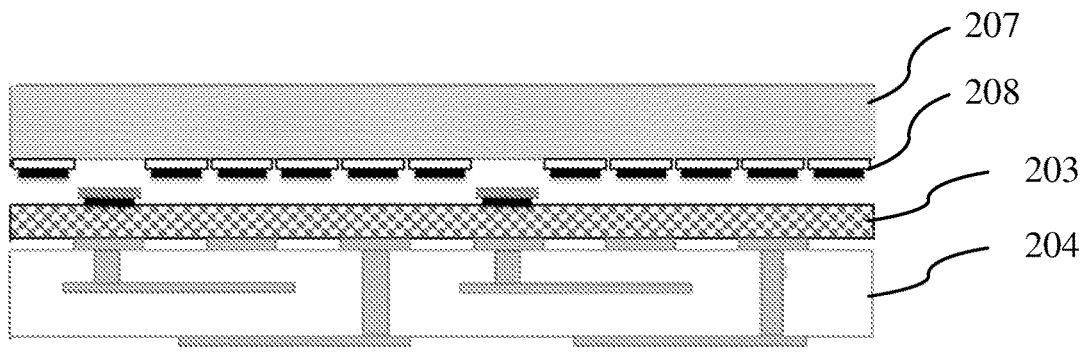

FIG. 4D shows an original substrate 207 and the green micro-LEDs 208 thereof. The green micro-LEDs to be lifted-off are aligned with the pads on the receiving substrate 204.

Figure 4E:
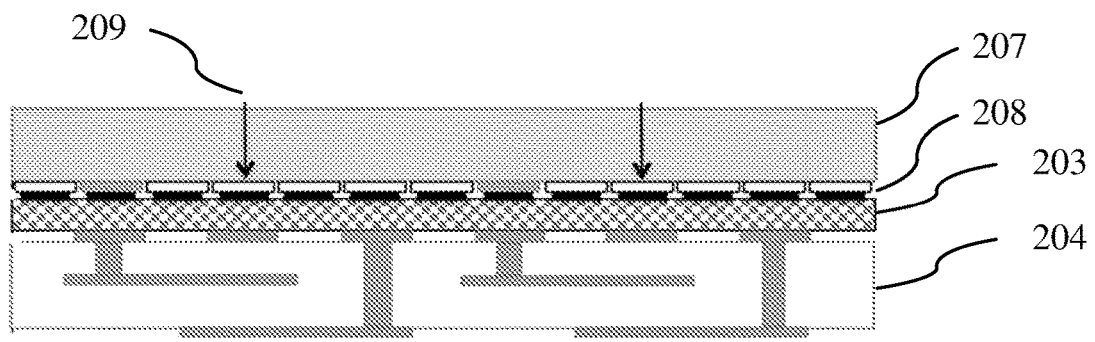

FIG. 4E shows the situation in which the green micro-LEDs 208 are in contact with the anisotropic conductive film 203 with a light force. At least one green micro-LED is selectively lifted-off by using laser 209.

Figure 4F:
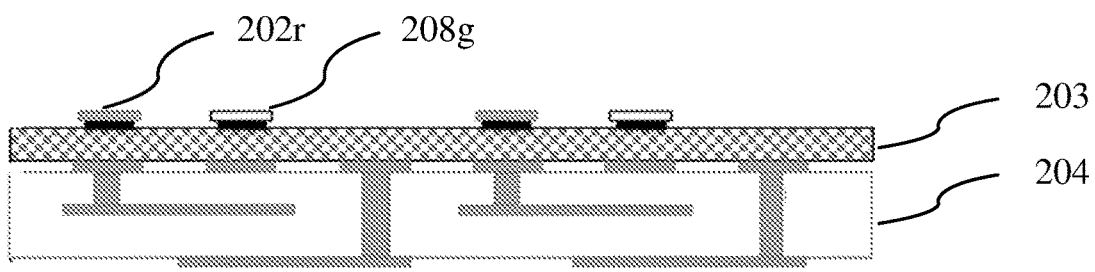

FIG. 4f shows lifted-off red micro-LEDs 202r and green micro-LEDs 208g.

Figure 4G:
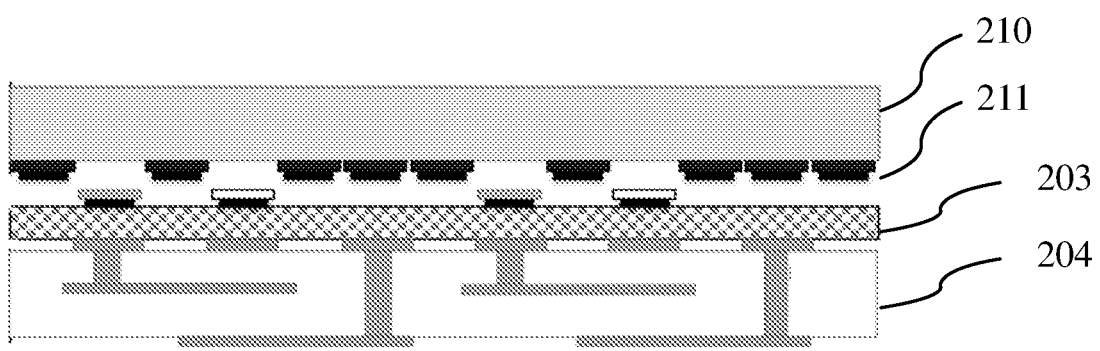

FIG. 4G shows an original substrate 210 and the blue micro-LEDs 211 thereof. The blue micro-LEDs to be lifted-off are aligned with the pads on the receiving substrate 204.

Figure 4H:
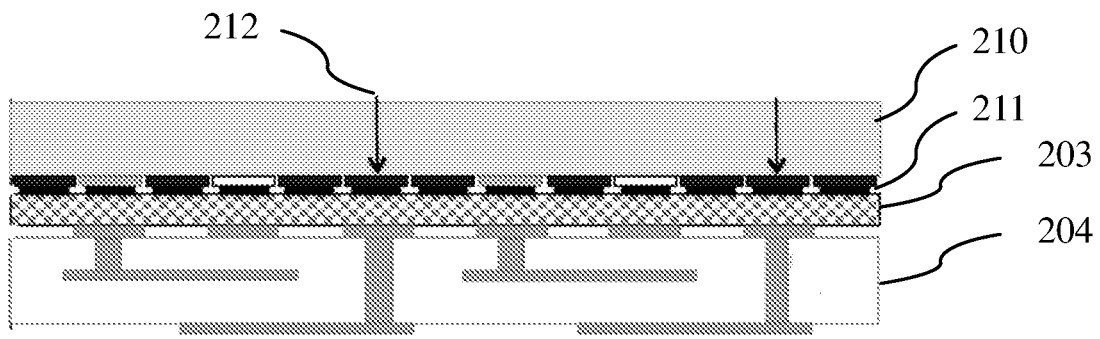

FIG. 4H shows the situation in which the blue micro-LEDs 211 are in contact with the anisotropic conductive film 203 with a light force. At least one blue micro-LED is selectively lifted-off by using laser 212.

Figure 4I:
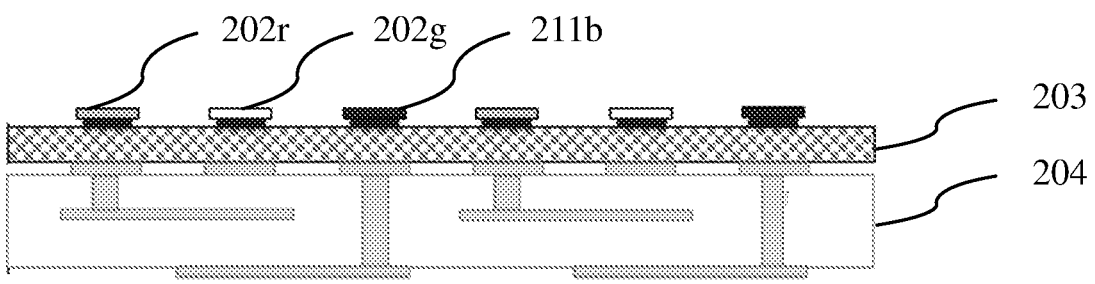

FIG. 4I shows lifted-off red micro-LEDs 202r, green micro-LEDs 208g and blue micro-LEDs 211b.

After the transfer of micro-LEDs in the three colors, an inspection and repair can be performed with respect to any defect.

Figure 4J:
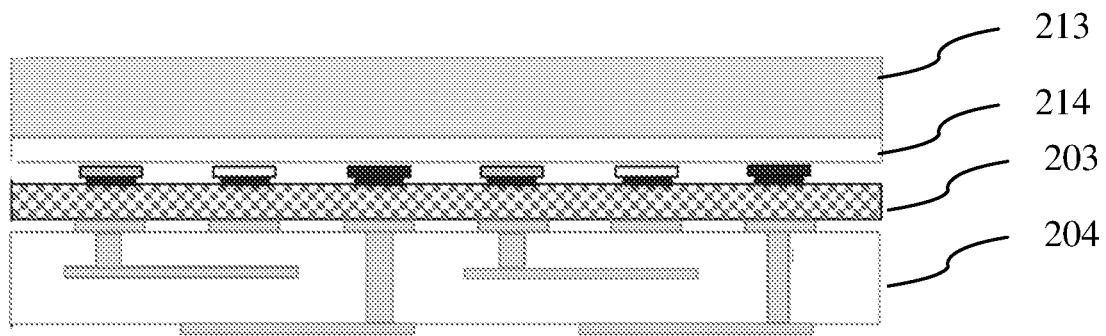

FIG. 4J shows an auxiliary substrate 213. The auxiliary substrate 213 is a flat rigid substrate, such a glass substrate. Polymer 214 such as 3M LC5200/5320 is coated on the auxiliary substrate 213. The polymer can be cured through UV and can be de-bonded through red laser.

Figure 4K:
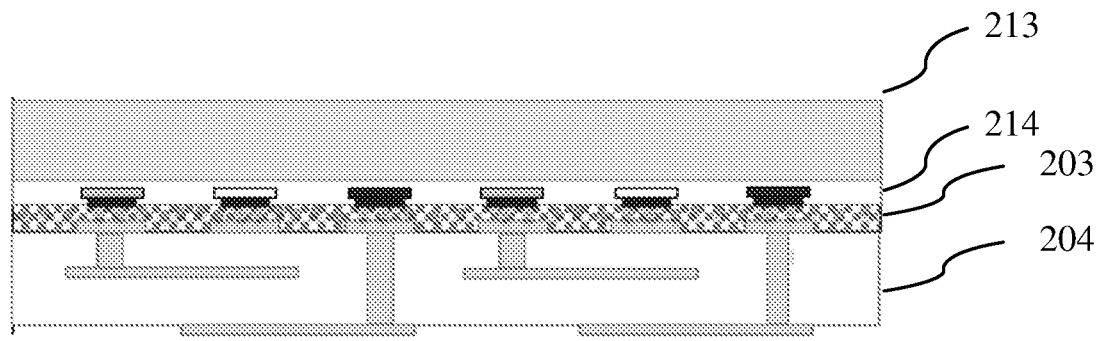

In FIG. 4K, the ACF 203 is processed through the auxiliary substrate 213. For example, the processing condition is that the temperature is be between 150° C. and 200° C., the applied pressure is between 1 MPa and 4 MPa, the time period of applying pressure is between 10 second and 30 second. Through these processes, the ACF 203 interconnects the micro-LEDs with corresponding pad in the vertical direction.

Then, the auxiliary substrate 213 is de-bonded (through the polymer 214).

Figure 4L:
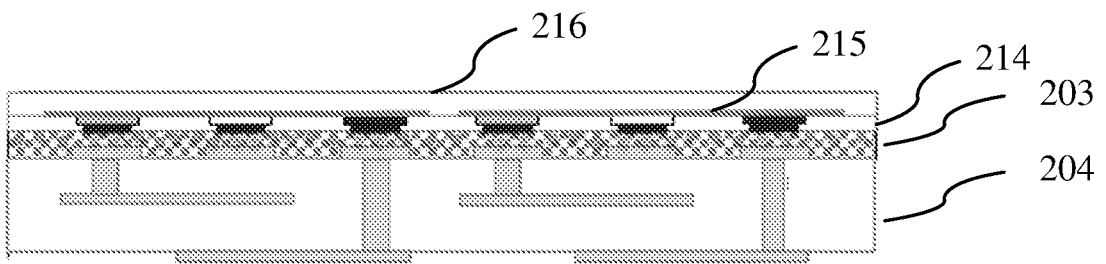

In FIG. 4L, the normal subsequent processes are performed: etching the polymer 214, to expose the epitaxial layers of the micro-LEDs; forming N-metal electrodes 215 (for example, ITO electrodes) on the epitaxial layers of the micro-LEDs; and performing encapsulation 216 on the N-metal electrodes (for example, PET lamination).

Figure 5:
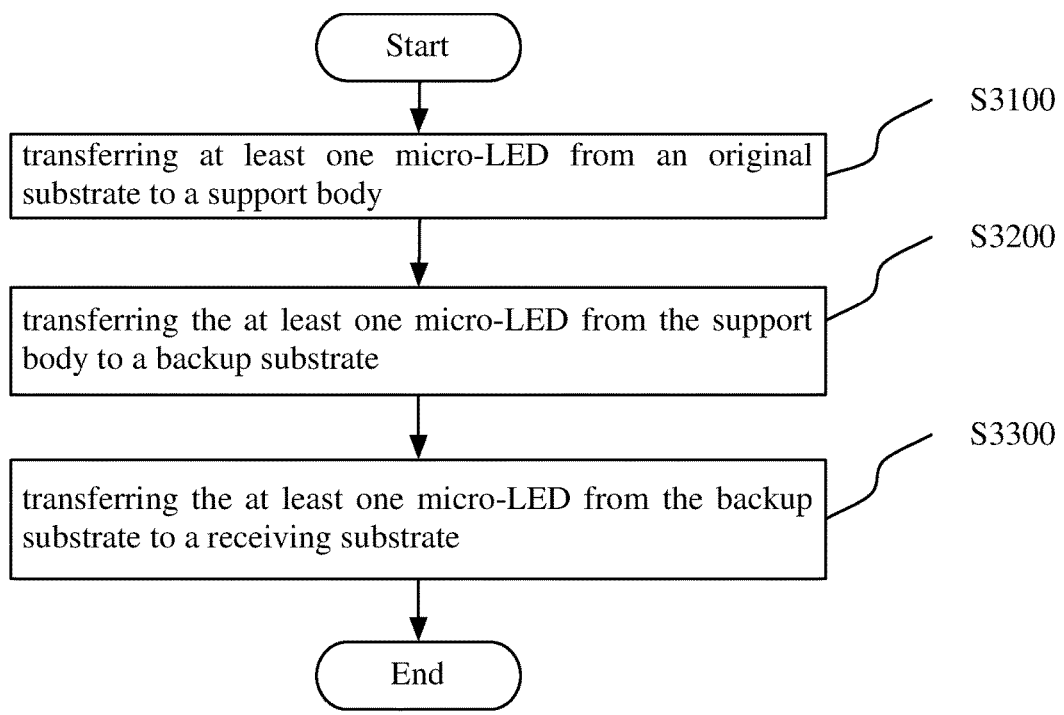
FIG. 5 shows a flow chart of still another illustrative embodiment of the method according to the present invention.

FIG. 5 shows a flow chart of still another illustrative embodiment of the method for transferring a micro-LED according to the present invention.

As shown in FIG. 5, at step S3100, at least one micro-LED is transferred from an original substrate to a support body. For example, the original substrate is laser-transparent.

In an example, this step can comprises: mounting the original substrate onto the support body, wherein the micro-LEDs are formed on the original substrate, the support body has light-release adhesive on its surface, and the micro-LEDs are adhered to the support body via the light-release adhesive; irradiating the original substrate with laser from the original substrate side, for lifting-off the at least one micro-LED from the original substrate, and irradiating light from the support body side, to release un-lifted-off micro-LEDs. In this example, the support body is transparent.

For example, the light-release adhesive can be a UV tape. For example, the support body is stiff. The displacement of micro-LEDs during transfer will have affect on the quality of the final product. The inventors of this application have found that this displacement can be reduced by using a stiff support body. This point has not been noticed by a person skilled in the art. For example, the material of the support body can be PET.

Generally, it is difficult to form red micro-LEDs on a laser-transparent substrate such as a sapphire substrate. Accordingly, in an example, the red micro-LEDs are formed in advance and then are transferred to an original substrate, for being finally transferred to a receiving substrate. For example, in this embodiment, red micro-LEDs can be formed on a growth substrate. Then, the red micro-LEDs are transferred to an intermediate substrate. After that, the red micro-LEDs are transferred from the intermediate substrate to the original substrate.

At step S3200, the at least one micro-LED are transferred from the support body to a backup substrate.

For example, the backup substrate has elastomer or polymer on its surface. For example, the at least one micro-LED are bonded to the backup substrate through the elastomer or polymer.

In an example, this step can further comprises: bonding the support body with the at least one micro-LED to the backup substrate, and irradiating light from the support body side, to release the at least one micro-LED.

At step S3300, the at least one micro-LED are transferred from the backup substrate to a receiving substrate.

In an example, the step can further comprises: aligning the at least one micro-LED with the pads on the receiving substrate; and lifting-off the at least one micro-LED via the elastomer or polymer.

For example, the above transfer steps can be performed with respect to red micro-LEDs, blue micro-LEDs and greed micro-LEDs, respectively. They will not be repeatedly described here.

After the above processes, normal subsequent processes can be done on the micro-LEDs. For example, the subsequent processes include: coating polymer on the receiving substrate with micro-LEDs; curing the polymer; etching the polymer, to expose the epitaxial layers of the micro-LEDs; forming N-metal electrodes on the epitaxial layers of the micro-LEDs; and performing encapsulation on the N-metal electrodes.

The inventors of this invention have found that during the transfer of micro-LEDs, usually, only part of the micro-LEDs on the original substrate are transferred. If the micro-LEDs are directly transferred to a receiving substrate, the remaining micro-LEDs on the original substrate are often contaminated. In this embodiment, this contamination can reduced through the transfer via an intermediate support body.

In another embodiment, the present invention further provides a method for manufacturing a micro-LED device. The manufacturing method comprises transferring micro-LEDs to a receiving substrate by using the method for transferring micro-LEDs according to this embodiment. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to said embodiment.

In another embodiment, the present invention further provides an electronic apparatus. The electronic apparatus contains a micro-LED device according to the embodiment. For example, the electronic apparatus can be a mobile phone, a pad and so on.

Generally, red micro-LEDs cannot be directly formed on a laser-transparent original substrate such as sapphire substrate. Thus, it is required that red micro-LEDs are formed on an additional substrate in advance, and then are transferred to a sapphire substrate. FIG. 6A to 6F shows an example for transferring red micro-LEDs according to the present invention.

Figure 6A:
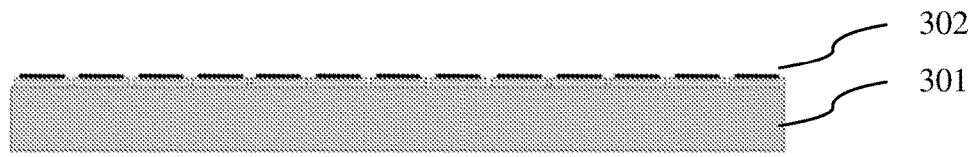
FIG. 6A to 6F shows an example for transferring red micro-LEDs according to the present invention.

As shown in FIG. 6A, red micro-LEDs 302 are formed on a growth substrate 301 such as GaAs substrate.

Figure 6B:
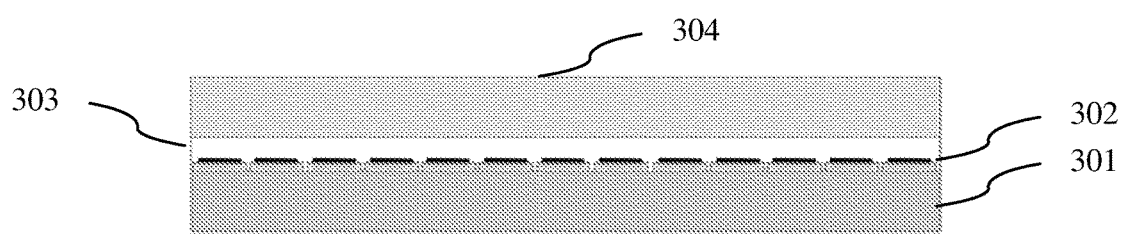

As shown in FIG. 6B, the red micro-LEDs 302 are bonded with intermediate substrate 304 such as silicon substrate, through temporary bonding polymer 303. The polymer 303 is a thermal release tape (TRT), for example.

Figure 6C:
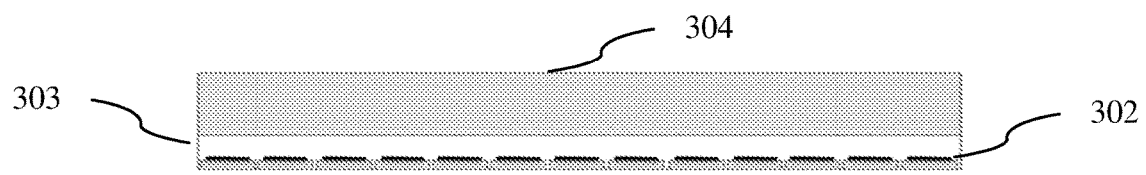

As shown in FIG. 6C, the growth substrate 301 is removed by a wet etching method, for example.

Figure 6D:
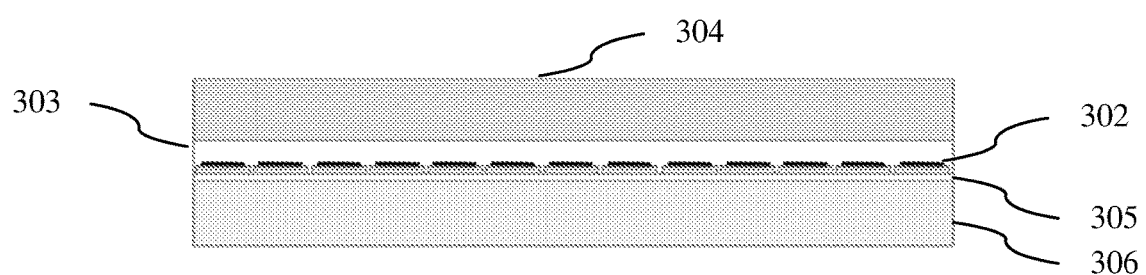

As shown in FIG. 6D, a light resist 305 is coated on an original substrate 306 such as sapphire substrate. The original substrate 306 and the red micro-LEDs 302 are bonded through the resist 305. The resist 305 can endure the temperature above 200° C.; generally above 250° C.

Figure 6E:
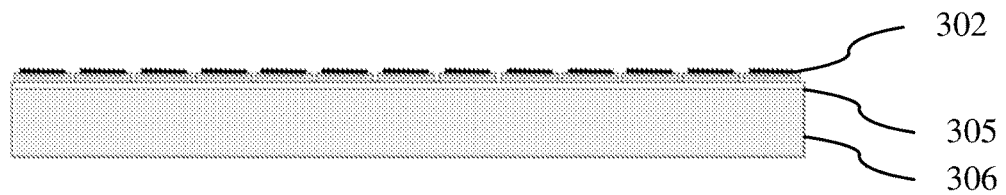

As shown in FIG. 6E, the polymer 303 is processed under a temperature less than 200° C., to remove the intermediate substrate 304.

Figure 6F:
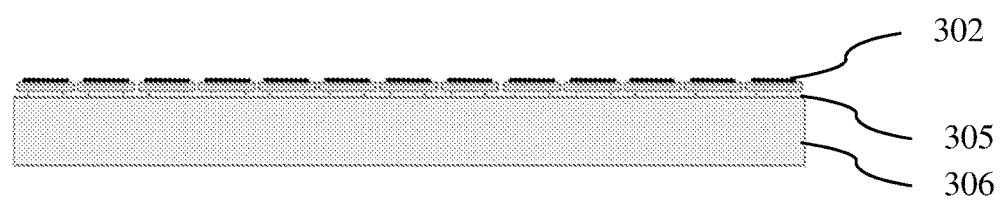

As shown in FIG. 6F, a O2 plasma etching is performed on the resist 305, to isolate the respective red micro-LEDs 302.

FIG. 7A to 7L shows still another example for transferring a micro-LED according to the present invention.

Figure 7A:
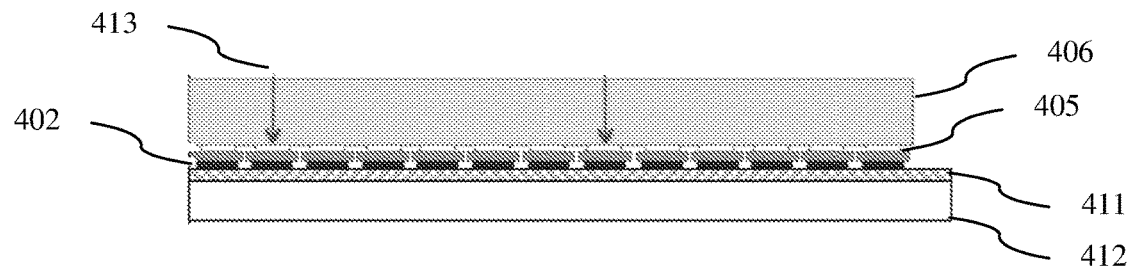
FIG. 7A to 7L shows still another example for transferring a micro-LED according to the present invention.

As shown in FIG. 7A, the original substrate 406 has resist 405 and red micro-LEDs 402 thereon. The red micro-LEDs 402 are mounted onto a UV tape 411. The UV tape 411 is located on a stiff PET support body 402. The red micro-LEDs are selectively lifted-off through laser 413.

Figure 7B:
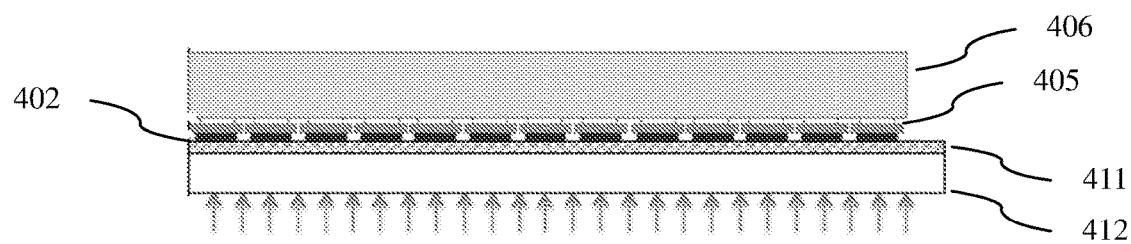

As shown in FIG. 7B, a ultraviolet is irradiated from the support body 412 side, to release un-lifted-off red micro-LEDs.

Figure 7C:
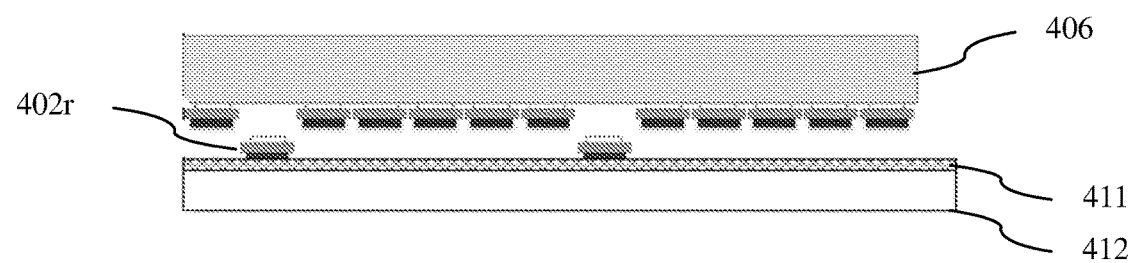

The lifted-off red micro-LEDs 402r are easily separated from the original substrate 406. As shown in FIG. 7C, the lifted-off red micro-LEDs 402r are adhered on the UV tape 411, while other red micro-LEDs remain on the original substrate 406.

Figure 7D:
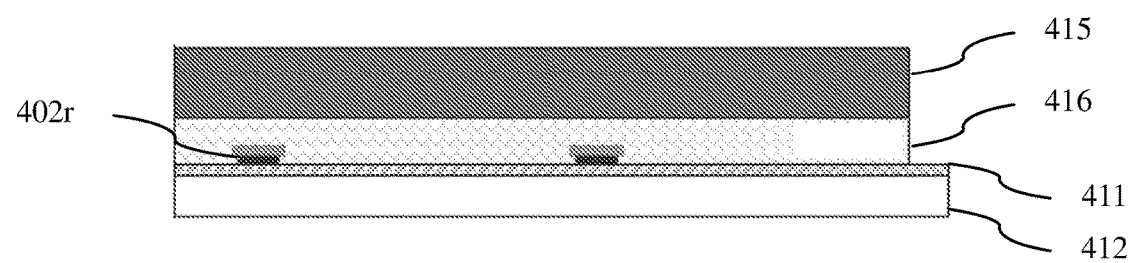

As shown in FIG. 7D, the backup substrate 415 such as glass substrate has elastomer/polymer 416 thereon. For example, the elastomer/polymer 416 is coated on the backup substrate 415 through spin coating. For example, the elastomer/polymer 416 is PDMS or 3M LC 5320, and can be cured through ultraviolet, for example.

Figure 7E:
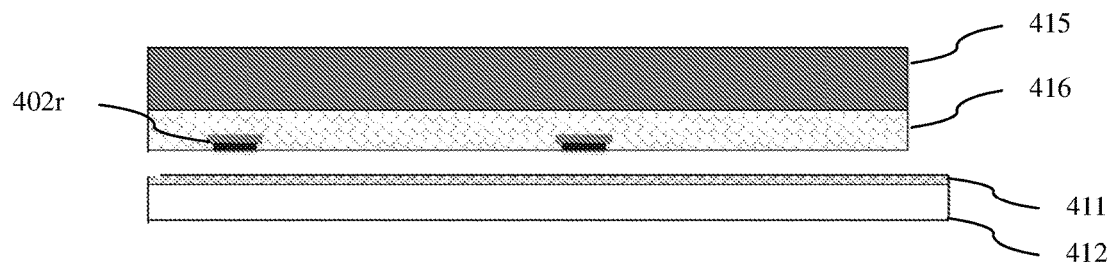
Figure 7F:
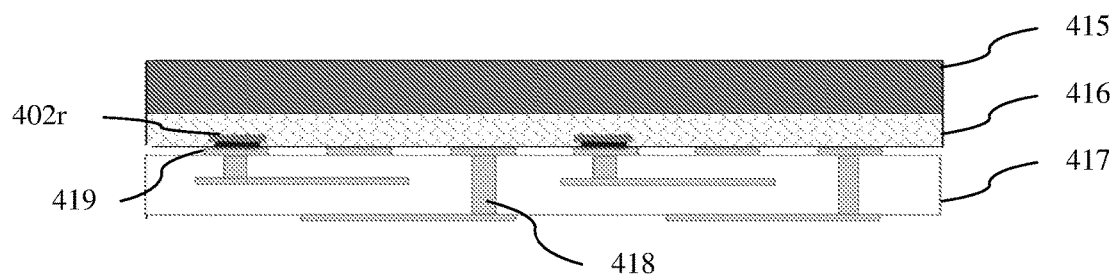

As shown in FIG. 7E, the support body is fully irradiated with ultraviolet, to release the red micro-LEDs and elastomer/polymer 416.

After that, for example, if the micro-LEDs do not have bumps thereon, the micro-LEDs on the backup substrate 415 can be screen-printed using silver paste.

As shown in 7F, the red micro-LEDs on the backup substrate 415 are aligned with the pads 419 on the receiving substrate 417. For example, the receiving substrate is a display substrate, and includes signal leads 418. For example, the red micro-LEDs are bonded to the pads 419 through reflow. The temperature of reflow can be more than 260° C. Then, the backup substrate 415 is separated from the receiving substrate 417 through laser lift-off.

Figure 7G:
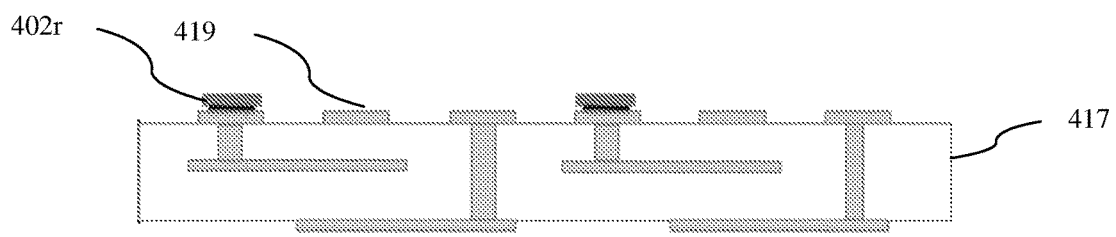

FIG. 7G shows separated receiving substrate 417. The receiving substrate 417 has pads 419 and red micro-LEDs 402r thereon.

Figure 7H:
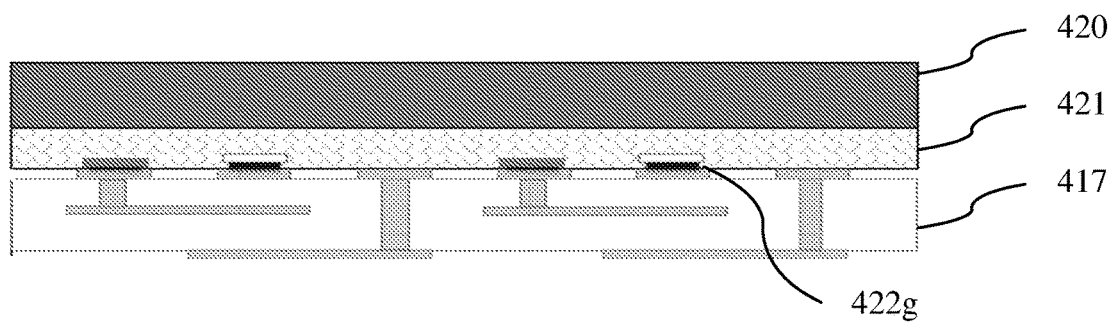

FIG. 7H shows a schematic diagram of transferring red micro-LEDs 422g from a backup substrate 420 to the receiving substrate 417. The backup substrate 420 has elastomer/polymer 421.

Figure 7I:
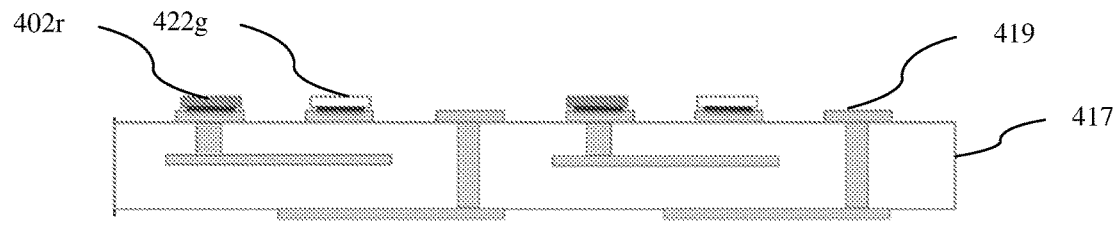

FIG. 7I shows the separated receiving substrate 417. The receiving substrate 417 has pads 419, red micro-LEDs 402r and green micro-LEDs 402r thereon.

Figure 7J:
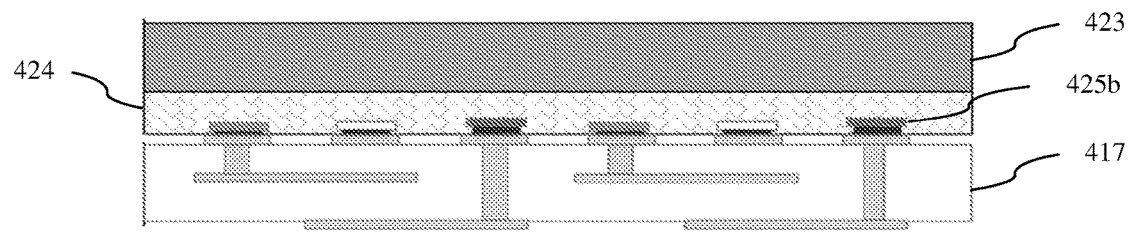

FIG. 7J shows a schematic diagram of transferring blue micro-LEDs 425b from a backup substrate 423 to the receiving substrate 417. The backup substrate 423 has elastomer/polymer 424.

Figure 7K:
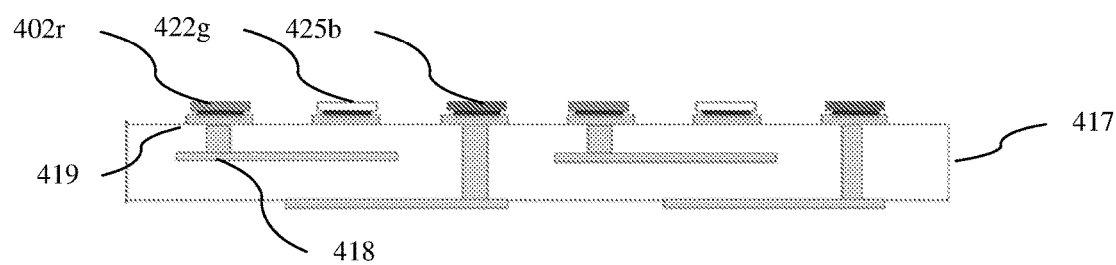

FIG. 7K shows the separated receiving substrate 417. The receiving substrate 417 has pads 419, red micro-LEDs 402r, green micro-LEDs 402r and blue micro-LEDs 425b thereon.

Figure 7L:
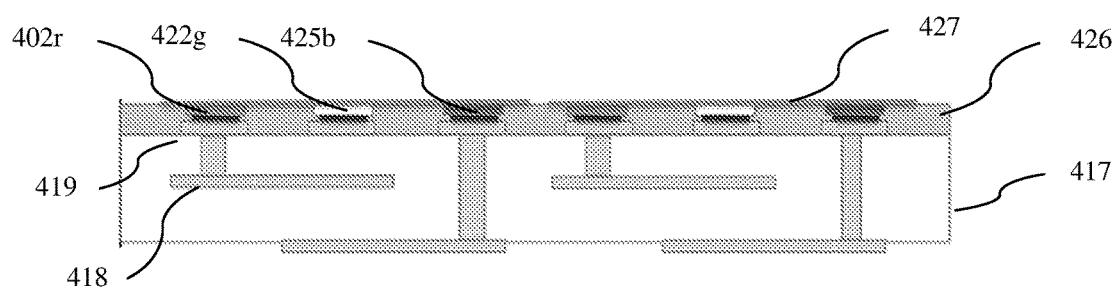

In FIG. 7L, the normal subsequent processes are performed on the transferred micro-LEDs: coating polymer 426 on the receiving substrate with micro-LEDs; curing the polymer 426; etching the polymer, to expose the epitaxial layers of the micro-LEDs; forming N-metal electrodes 427 on the epitaxial layers of the micro-LEDs; and performing encapsulation (not shown) on the N-metal electrodes.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for transferring micro-LEDs, comprising:
    forming micro-LEDs on a laser-transparent original substrate;
    providing an anisotropic conductive layer on a receiving substrate;
    bringing the micro-LEDs into contact with the anisotropic conductive layer on the receiving substrate;
    irradiating the laser-transparent original substrate with laser from an original substrate side to lift-off the micro-LEDs from the laser-transparent original substrate; and
    processing the anisotropic conductive layer, to electrically connect the micro-LEDs via the anisotropic conductive layer on the receiving substrate,
    wherein processing the anisotropic conductive layer further comprises:
        applying pressure on the anisotropic conductive layer from a micro-LED side by using an auxiliary substrate, a surface of the auxiliary substrate being coated with a temporary bonding polymer,
        bonding the auxiliary substrate with the anisotropic conductive layer via the temporary bonding polymer; and
        after applying the pressure, de-bonding the auxiliary substrate via the temporary bonding polymer, to remove the auxiliary substrate.

2. The method according to claim 1, wherein a temperature of processing the anisotropic conductive layer is between 150° C. and 200° C., the applied pressure is between 1 MPa and 4 MPa, and a time period of applying the pressure is between 10 second and 30 second.

3. The method according to claim 1, wherein the auxiliary substrate is a flat rigid substrate.

4. The method according to claim 1, further comprising:
    etching the temporary bonding polymer, to expose epitaxial layers of the micro-LEDs;
    forming N-metal electrodes on the epitaxial layers of the micro-LEDs; and
    performing encapsulation on the N-metal electrodes.

5. The method according to claim 1, wherein the anisotropic conductive layer is at least one of an anisotropic conductive film, an anisotropic conductive paste and an anisotropic conductive tape.

6. A method for manufacturing a micro-LED device, comprising transferring a micro-LED to a receiving substrate by using the method according to claim 1.

7. A micro-LED device, which is manufactured by using the method according to claim 6, wherein the micro-LEDs come into electronic contact with pads on the receiving substrate via the anisotropic conductive layer.

8. An electronic apparatus, containing a micro-LED device according to claim 7.

* * * * *